United States Patent
Irvin et al.

(10) Patent No.: US 9,534,776 B2
(45) Date of Patent: Jan. 3, 2017

(54) TASK-LIT CABINET

(71) Applicant: AT&T Intellectual Property I, L.P., Atlanta, GA (US)

(72) Inventors: David Irvin, Lawrence, KS (US); Todd Andrew Fryer, Liberty, MO (US); Nicholas A. Nicas, Blue Springs, MO (US)

(73) Assignee: AT&T INTELLECTUAL PROPERTY I, L.P., Atlanta, GA (US)

(*) Notice: Subject to any disclaimer, the term of this patent is extended or adjusted under 35 U.S.C. 154(b) by 25 days.

(21) Appl. No.: 14/730,337

(22) Filed: Jun. 4, 2015

(65) Prior Publication Data
US 2015/0267912 A1 Sep. 24, 2015

Related U.S. Application Data

(63) Continuation of application No. 13/112,215, filed on May 20, 2011, now Pat. No. 9,076,893.

(51) Int. Cl.
| | |
|---|---|
| *H05K 7/18* | (2006.01) |
| *F21V 33/00* | (2006.01) |
| *F21S 9/04* | (2006.01) |
| *H01L 35/00* | (2006.01) |
| *F21V 23/04* | (2006.01) |
| *H01L 35/02* | (2006.01) |
| *F21W 131/301* | (2006.01) |
| *H02N 11/00* | (2006.01) |
| *F21Y 101/00* | (2016.01) |

(52) U.S. Cl.
CPC .............. *F21V 33/0012* (2013.01); *F21S 9/04* (2013.01); *F21V 23/04* (2013.01); *H01L 35/00* (2013.01); *H01L 35/02* (2013.01); *H05K 7/183* (2013.01); *F21W 2131/301* (2013.01); *F21Y 2101/00* (2013.01); *H02N 11/008* (2013.01); *Y10S 74/09* (2013.01)

(58) Field of Classification Search
CPC .................................. H01L 23/38; H01L 35/00
See application file for complete search history.

(56) References Cited

U.S. PATENT DOCUMENTS

| | | | | |
|---|---|---|---|---|
| 5,419,780 A | * | 5/1995 | Suski | ....................... H01L 23/38 136/201 |
| 5,427,086 A | * | 6/1995 | Brownell | .............. F24H 9/2085 126/110 E |
| 6,574,963 B1 | | 6/2003 | Monzon et al. | |
| 6,591,610 B2 | | 7/2003 | Yazawa et al. | |
| 6,601,390 B1 | | 8/2003 | Yazawa et al. | |

(Continued)

FOREIGN PATENT DOCUMENTS

WO    WO 2010120287    10/2010

*Primary Examiner* — Robert J Hoffberg
(74) *Attorney, Agent, or Firm* — Scott P. Zimmerman, PLLC

(57) ABSTRACT

Methods, apparatuses, and products passively generate electrical energy from waste heat. Electronic components in cabinets generate waste heat that is used to illuminate an interior of a cabinet. A thermovoltaic semiconductor detects a temperature differential between a pair of terminals installed in the cabinet. The thermovoltaic semiconductor generates a low voltage output in response to the temperature differential. A power supply receives the low voltage output and produces a higher voltage for low-wattage light sources installed in the cabinet.

13 Claims, 11 Drawing Sheets

(56) References Cited

U.S. PATENT DOCUMENTS

| | | |
|---|---|---|
| 6,658,861 B1 | 12/2003 | Ghoshal et al. |
| 6,702,661 B1 | 3/2004 | Clifton et al. |
| 6,787,691 B2 | 9/2004 | Fleurial et al. |
| 6,799,282 B2 | 9/2004 | Maeda et al. |
| 6,856,037 B2 | 2/2005 | Yazawa et al. |
| 6,877,318 B2 | 4/2005 | Tadayon et al. |
| 7,081,684 B2 | 7/2006 | Patel et al. |
| 7,152,710 B1 | 12/2006 | Huang et al. |
| 7,200,005 B2 | 4/2007 | Von Gutfeld et al. |
| 7,351,215 B1 | 4/2008 | Roberts |
| 7,397,068 B2 | 7/2008 | Park et al. |
| 7,411,337 B2 | 8/2008 | Tadayon et al. |
| 7,608,974 B2 | 10/2009 | Sung |
| 7,800,567 B2 | 9/2010 | Fujino |
| 7,919,936 B2 | 4/2011 | Liu et al. |
| 7,939,743 B2 | 5/2011 | Leng et al. |
| 8,038,331 B2 | 10/2011 | Kino et al. |
| 8,074,456 B2 * | 12/2011 | Shah ................ F25B 21/02  62/259.2 |
| 8,169,147 B2 | 5/2012 | Hsu et al. |
| 8,274,230 B2 | 9/2012 | Chiu |
| 8,288,955 B2 | 10/2012 | Rowland |
| 8,393,746 B2 | 3/2013 | Lee |
| 8,503,139 B2 | 8/2013 | Yao et al. |
| 8,941,256 B1 * | 1/2015 | Czamara ............... F03D 9/00  290/55 |
| 9,141,155 B2 * | 9/2015 | Wiley .................. G06F 1/20 |
| 9,144,181 B2 * | 9/2015 | Wiley ............. H05K 7/20745 |
| 2003/0133265 A1 | 7/2003 | Kinsey et al. |
| 2004/0261831 A1 | 12/2004 | Tsuneoka et al. |
| 2005/0060884 A1 | 3/2005 | Okamura et al. |
| 2007/0056622 A1 | 3/2007 | Leng et al. |
| 2008/0239672 A1 | 10/2008 | Ghoshal et al. |
| 2009/0034202 A1 * | 2/2009 | Chiu .................... G06F 1/203  361/704 |
| 2009/0091950 A1 | 4/2009 | Chao et al. |
| 2009/0135587 A1 | 5/2009 | Oketani et al. |
| 2009/0205694 A1 * | 8/2009 | Huettner .............. H01L 35/30  136/201 |
| 2009/0251912 A1 | 10/2009 | Kino et al. |
| 2009/0315471 A1 | 12/2009 | Rowland |
| 2010/0043858 A1 | 2/2010 | Matsui et al. |
| 2012/0006505 A1 * | 1/2012 | Trojer ................. H05K 7/206  165/48.1 |
| 2012/0038175 A1 | 2/2012 | Tang et al. |
| 2012/0152298 A1 | 6/2012 | Casali et al. |
| 2012/0309284 A1 * | 12/2012 | Dernis ............... F24F 11/0001  454/184 |

* cited by examiner

TASK-LIT CABINET

CROSS-REFERENCE TO RELATED APPLICATION

This application is a continuation of U.S. application Ser. No. 13/112,215 filed May 20, 2011 and since issued as U.S. Pat. No. 9,076,893, which is incorporated herein by reference in its entirety.

BACKGROUND

Exemplary embodiments generally relate to power plants, to prime-mover dynamo plants, and to electrical systems and devices and, more particularly, to motive fluid energized by externally applied heat, to fluid-current motors, to ventilation, to electronic cabinets, and to electrical systems and devices.

Data centers generate waste heat. Data centers house racks of electronic components in cabinets. Because the electronic components generate waste heat, the waste heat could be reused.

BRIEF DESCRIPTION OF THE SEVERAL VIEWS OF THE DRAWINGS

The features, aspects, and advantages of the exemplary embodiments are better understood when the following Detailed Description is read with reference to the accompanying drawings, wherein.

DETAILED DESCRIPTION

The exemplary embodiments will now be described more fully hereinafter with reference to the accompanying drawings. The exemplary embodiments may, however, be embodied in many different forms and should not be construed as limited to the embodiments set forth herein. These embodiments are provided so that this disclosure will be thorough and complete and will fully convey the exemplary embodiments to those of ordinary skill in the art. Moreover, all statements herein reciting embodiments, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating the exemplary embodiments. The functions of the various elements shown in the figures may be provided through the use of dedicated hardware as well as hardware capable of executing associated software. Those of ordinary skill in the art further understand that the exemplary hardware, software, processes, methods, and/or operating systems described herein are for illustrative purposes and, thus, are not intended to be limited to any particular named manufacturer.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will also be understood that, although the terms first, second, etc. may be used herein to describe various elements, these elements should not be limited by these terms. These terms are only used to distinguish one element from another. For example, a first device could be termed a second device, and, similarly, a second device could be termed a first device without departing from the teachings of the disclosure.

Figure 1:
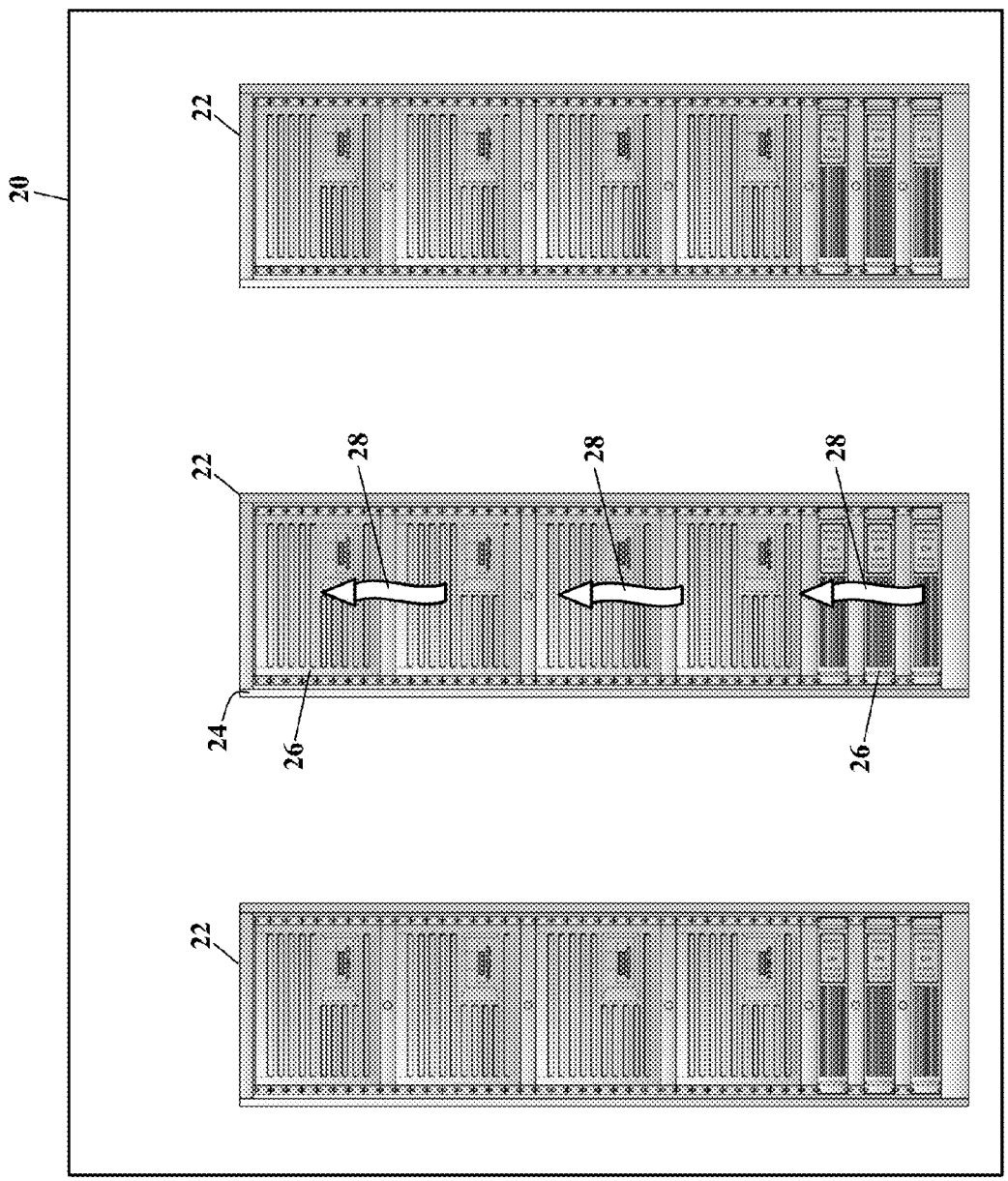
FIG. 1 is a simplified schematic illustrating an environment in which exemplary embodiments may be implemented.
Figure 2:
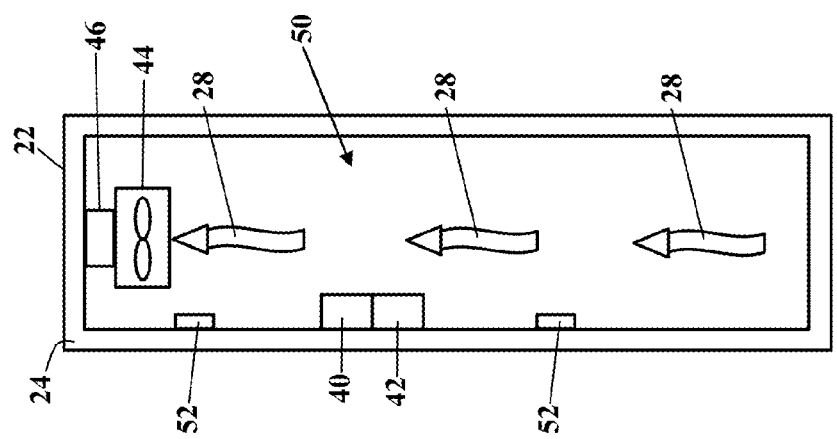
FIG. 2 illustrates passive electrical generation, according to exemplary embodiments.

FIGS. 1 and 2 are simplified schematics illustrating an environment in which exemplary embodiments may be implemented. FIG. 1 illustrates a data center 20 housing one or more cabinets 22. While only a few cabinets 22 are illustrated, the data center 20 may house many cabinets 22, such as fifty (50) or even more cabinets. Each cabinet 22 houses a vertical or horizontal rack 24. Various electronic components 26 are installed in each rack 24. The electronic components 26 may include servers, routers, storage devices, computers, and/or any other equipment needed or desired. Regardless, the electronic components 26 generate waste heat 28 during their operation, as is well-known.

FIG. 2 illustrates passive electrical generation, according to exemplary embodiments. Here, exemplary embodiments recover energy contained in the waste heat 28. The cabinet 22 houses a power supply 40. The power supply 40, however, is passive in that no electrical energy from an electrical grid is fed or input to the power supply 40. The power supply 40, instead, generates electrical power from the waste heat 28. The power supply 40, for example, receives electrical power produced by a thermovoltaic semiconductor 42. The thermovoltaic semiconductor 42 generates electrical energy from the waste heat 28 (as later paragraphs will explain). Similarly, the power supply 40 receives electrical power produced by a passive turbine 44. The passive turbine 44 is rotated by a thermal draft produced by the waste heat 28 (as later paragraphs will also explain). The turbine 44 mechanically couples to a generator 46, and the generator 46 converts mechanical energy into electrical energy. The power supply 40 is electrically coupled to the generator 46 to receive electrical power generated from the thermal draft produced by the waste heat 28. The electrical energy produced by the thermovoltaic semiconductor 42 and/or the generator 46 is fed or input to the power supply 40. The power supply 40 may then process or condition the electrical energy for use.

Exemplary embodiments provide interior lighting of the cabinet 22. Because the waste heat 28 is used to generate electrical energy, the electrical energy may be used to light an interior 50 of the cabinet 22. The cabinet 22 may include one or more light sources 52. Each light source 52 receives electrical power from the power supply 40 and outputs visible light to the interior 50 of the cabinet 22. While the light sources 52 may include incandescent filaments, halogen elements, and other conventional light bulbs, the light sources 52 are preferably light emitting diodes (or "LEDs"). Light emitting diodes provide ample illumination and, yet, operate at low voltages. Should the electronic components 26 in the cabinet 22 need service, exemplary embodiments thus permit illuminating the interior 50 of the cabinet 22 without electrical power from the electrical grid. Exemplary embodiments thus recycle the existing waste heat 28 into free lighting while reducing overhead lighting and energy costs.

Figure 3:
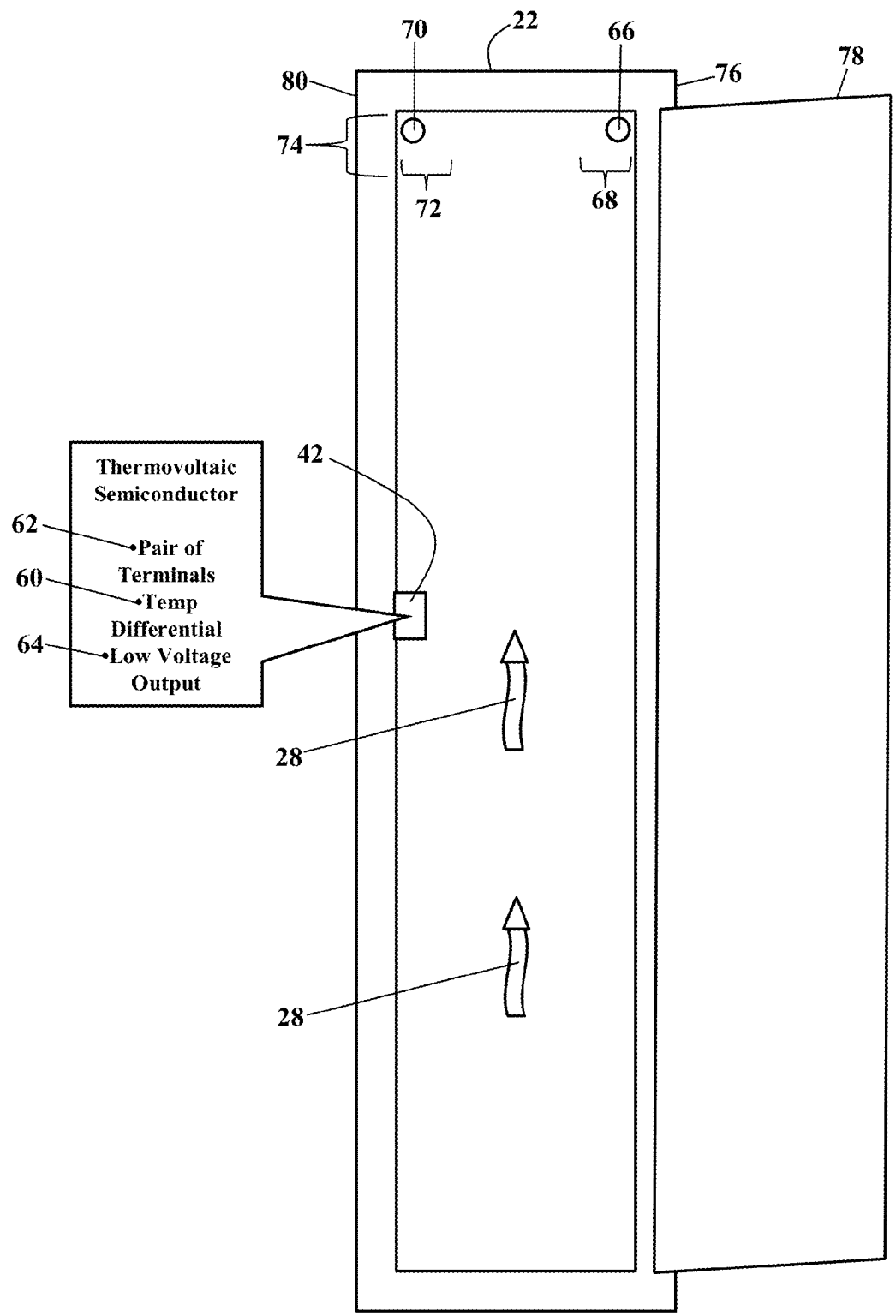
FIG. 3 is a more detailed schematic illustrating a cabinet, according to exemplary embodiments.

FIG. 3 is a more detailed schematic illustrating the cabinet 22, according to exemplary embodiments. Here the thermovoltaic semiconductor 42 detects a temperature differential 60 between a pair 62 of terminals. The thermovoltaic semiconductor 42 then generates a low voltage output 64 in response to the temperature differential 60. A first terminal 66 of the pair 62 of terminals, for example, may be installed in or proximate a cooler portion 68 of the cabinet 22. A second terminal 70 of the pair 62 of terminals may be installed in or proximate a warmer portion 72 of the cabinet 22. The thermovoltaic semiconductor 42 then generates the low voltage output 64 in response to the temperature differential 60 between the cooler portion 68 of the cabinet 22 and the warmer portion 72 of the cabinet 22.

A maximum temperature differential is desired. Because the thermovoltaic semiconductor 42 generates the low voltage output 64 in response to the temperature differential 60, a maximum temperature differential generates a maximum electrical power. Temperature testing or temperature probing may thus be used to determine a coolest location within the cabinet 22 and a hottest location within the cabinet 22. The cooler portion 68 of the cabinet 22 may thus be any location or region within the cabinet 22 having a lowest operating temperature, while the warmer portion 72 of the cabinet 22 may thus be any location or region within the cabinet 22 having a hottest operating temperature. FIG. 2, for example, illustrates the first terminal 66 located at or proximate an upper area 74 of a front side 76 of the cabinet 22. The front side 76 of the cabinet 22 may be, or contain, an access door 78 that allows access to the electrical components (illustrated as reference numeral 26 in FIG. 1). Testing has shown that the upper area 74 of the front side 76 may be the coolest location within the cabinet 22. FIG. 2 also illustrates the second terminal 70 installed in or proximate the upper area 74 of a back side 80 of the cabinet 22, where testing reveals the hottest location.

The thermovoltaic semiconductor 42 generates electrical energy and power from the waste heat 28. The pair 62 of terminals detects the temperature differential 60 between the first terminal 66 and the second terminal 70. The thermovoltaic semiconductor 42 is a semiconductor material that generates the low voltage output 64 in response to the temperature differential 60. The thermovoltaic semiconductor 42 thus converts thermal energy into an electrical potential.

Figure 4:
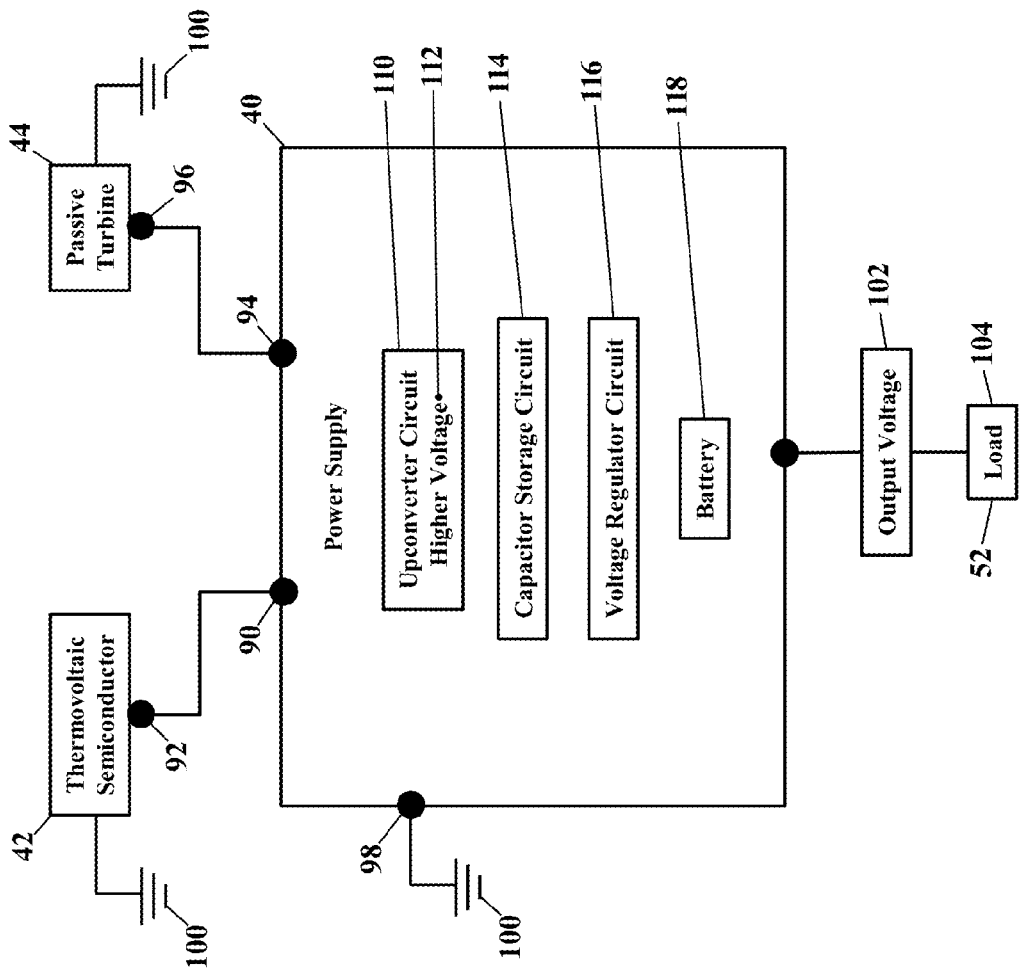
FIG. 4 is a block diagram illustrating a power supply, according to exemplary embodiments.

FIG. 4 is a block diagram illustrating the power supply 40, according to exemplary embodiments. Here the power supply 40 receives electrical power generated by the thermovoltaic semiconductor 42 and/or by the passive turbine 44. The power supply 40, for example, has a first input 90 connected to an output 92 of the thermovoltaic semiconductor 42. The power supply 40 also has a second input 94 connected to an output 96 of the passive turbine 44. The power supply 40 may also has a connection 98 to electrical ground 100. The power supply 40 thus receives electrical power that has been passively generated by the thermovoltaic semiconductor 42 and/or by the passive turbine 44. The power supply 40 produces an output voltage 102 that drives a load 104. Here, though, the load 104 is a series or parallel arrangement of the light sources 52 (such as light emitting diodes) for illuminating the interior of the cabinet.

The power supply 40 may include an upconverter circuit 110. The upconverter circuit 110 boosts, or steps up, voltages available from the thermovoltaic semiconductor 42 and/or by the passive turbine 44. The upconverter circuit 110, in other words, converts the low voltage output 64 (generated by the thermovoltaic semiconductor 42) to a higher voltage 112. The upconverter circuit 110, likewise, converts any low voltage generated by the passive turbine 44 to the higher voltage 112. The power supply 40, for example, may receive a 1 Volt direct current (DC) input and produce the higher voltage of 12 Volts DC. Even though the upconverter circuit 110 boosts low voltages to higher voltages, total power remains the same. That is, conservation of energy requires that power input to the upconverter circuit 110 must be equal to power output from the upconverter circuit 110. So, even though low voltages are boosted, current may be reduced.

The power supply 40 may also include a capacitor storage circuit 114. The capacitor storage circuit 114 utilizes one or more capacitors to store electrical power transferred by the upconverter circuit 110 (as later paragraphs will explain).

The power supply 40 may also include a voltage regulator circuit 116. The voltage regulator circuit 116 controls the output voltage 112 (and/or an output current) to a specific value. That is, the output voltage 112 is held nearly constant despite variations in electrical power generated by the thermovoltaic semiconductor 42 and/or the passive turbine 44. Light emitting diodes, for example, may require a relatively constant voltage (e.g., 3 Volts DC) for operation. The voltage regulator circuit 116 helps ensure the power supply provide adequate voltage to power light emitting diodes.

The power supply 40 may also include means for storing electrical energy. When electrical power is passively generated by the thermovoltaic semiconductor 42 and/or by the passive turbine 44, the electrical power may be stored for later retrieval and use. A battery 118, for example, may be used to store electrical power passively generated by the thermovoltaic semiconductor 42 and/or by the passive turbine 44. The battery 118 may have any chemical and/or metallurgical construction for storing electrical energy. Because batteries are well known to those of ordinary skill in the art, a further description of the battery 118 is not necessary.

Figure 5:
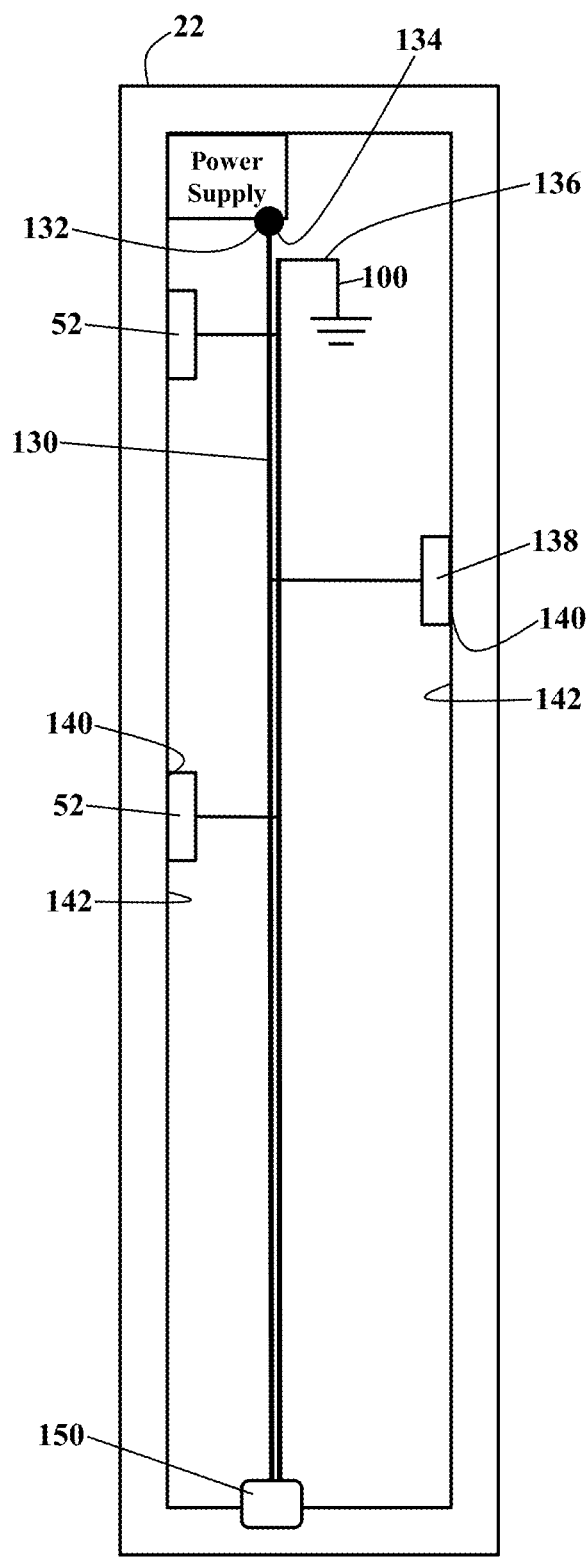
FIGS. 5 and 6 are schematics illustrating a bus cable, according to exemplary embodiments.
Figure 6:
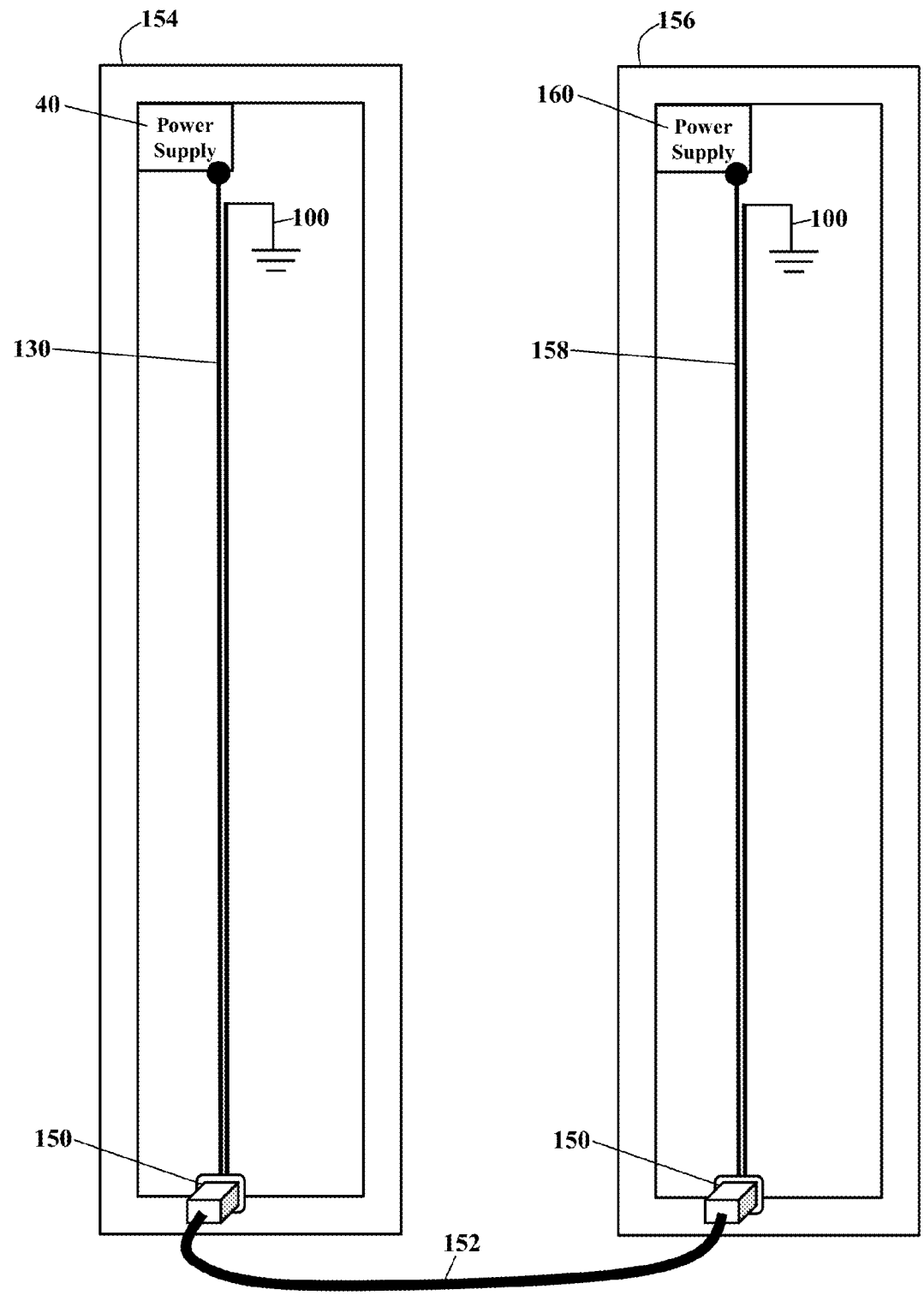

FIGS. 5 and 6 are schematics illustrating a bus cable 130, according to exemplary embodiments. The bus cable 130 has a first connection 132 to an output terminal 134 of the power supply 40. The bus cable 130 has a second connection 136 to the electrical ground 100. The bus cable 130 receives the output voltage (illustrated as reference numeral 102 in FIG. 4) produced by the power supply 40 and distributes the output voltage 102 along the bus cable 130. Each light emitting diode 52 may thus connect to the bus cable 130 to receive the output voltage 102 for illuminating the cabinet 22. Each light emitting diode 52 is preferably an inexpensive, but efficient, strip 138 that adhesively adheres 140 to an interior side wall 142 of the cabinet 22. The bus cable 130 may also adhesively adhere to the interior side wall 142 of the cabinet 22. An inexpensive adhesive, double-sided tape, or even a hook-and-loop fastener may be used to quickly and easily secure the bus cable 130 and each light emitting diode 52 to the interior side wall 142 of the cabinet 22. The bus cable 130 and each light emitting diode 52, however, may alternatively be secured by mechanical fasteners.

As FIG. 6 illustrates, the bus cable 130 may include a connection 150 to other cabinets. Because the data center 20 may have many cabinets storing the electrical components, the cabinets may be connected, or daisy-chained, together. A cable 152 may connect a first cabinet 154 to a neighboring second cabinet 156. The connection 150 thus permits the first cabinet 154 to supply electrical power to the neighboring second cabinet 156. The connection 150, likewise, also permits the first cabinet 154 to consume electrical power from the neighboring second cabinet 156. As FIG. 6 illustrates, the bus cable 130 may physically connect to a second bus cable 158 installed or operating in the neighboring second cabinet 156. The connection 150 may this be a male-to-female connector that establishes a series or parallel connection to the second bus cable 158. All the cabinets in the data center 20 may thus be interconnected to provide, or draw, electrical power in times of electrical need. For example, should the power supply 40 be unable to provide enough electrical power to illuminate the first cabinet 154, then a neighboring power supply 160 in the second cabinet 156 may provide electrical power to illuminate the first cabinet 154.

Figure 7:
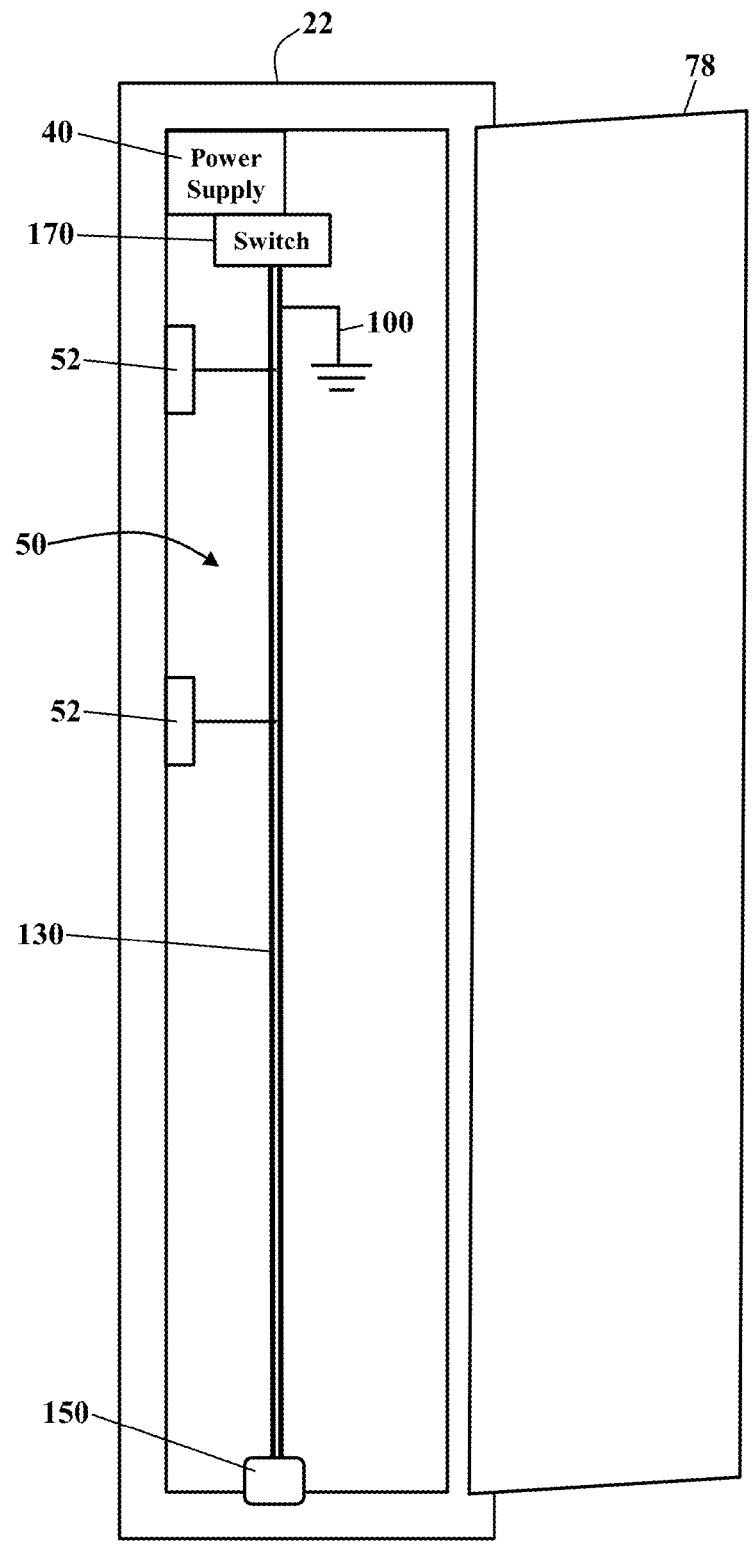
FIG. 7 is a schematic illustrating a switch, according to exemplary embodiments.

FIG. 7 is a schematic illustrating a switch 170, according to exemplary embodiments. Here the power supply 40 may electrically interface with, or connect to, the switch 170 to control application of the output voltage 102 to the bus cable 130. The switch 170, for example, allows personnel to illuminate the interior 50 of the cabinet 22. When the switch is open (or "off"), the output voltage 102 from the power supply 40 is not applied to the bus cable 130. When the switch is closed, though, the switch 170 is "on" and the output voltage 102 from the power supply 40 is applied to the bus cable 130. The switch 170, for example, is preferably actuated by the access door 78 of the cabinet 22. When the access door 78 is open, the switch 170 closes to illuminate the interior 50 of the cabinet 22. When the access door 78 is closed, the switch 170 opens and removes illumination. The switch 170 may thus create a connection between the power supply 40 and the bus cable 130 to produce illumination. The switch 170, however, may be any switch with any configuration or mounting (such as a wall switch or toggle switch).

Figure 8:
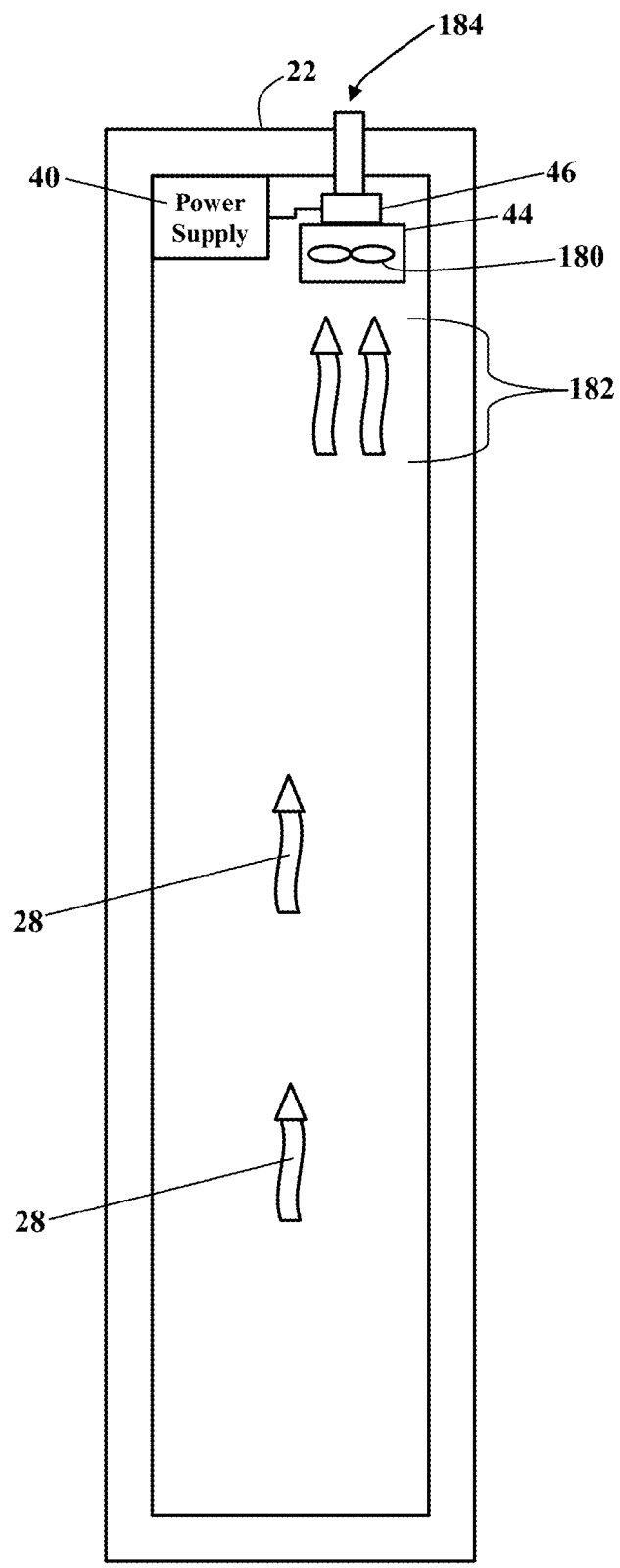
FIG. 8 is a schematic illustrating a passive turbine, according to exemplary embodiments.

FIG. 8 is a schematic illustrating the passive turbine 44, according to exemplary embodiments. The passive turbine 44 has a rotor assembly 180. As the electrical components (illustrated as reference numeral 22 in FIG. 1) generate the waste heat 28, the waste heat 28 produces a thermal draft 182. The cabinet 22 may have an exit port 184 through which the thermal draft 182 convects or flows. The passive turbine 44 is placed in the flow of the thermal draft 182, such that the thermal draft 182 drives one or more blades of the rotor assembly 180. The rotor assembly 180 turns or drives the generator 46. The generator 46 converts mechanical energy of the rotor assembly 180 into electrical energy (either alternating current or direct current, as is known). The electrical power generated by the passive turbine 44 is fed to, or received by, the power supply 40. The power supply 40 produces the output voltage 102 that drives the load 104 (such as the light sources 52, as earlier paragraphs explained).

Figure 9:
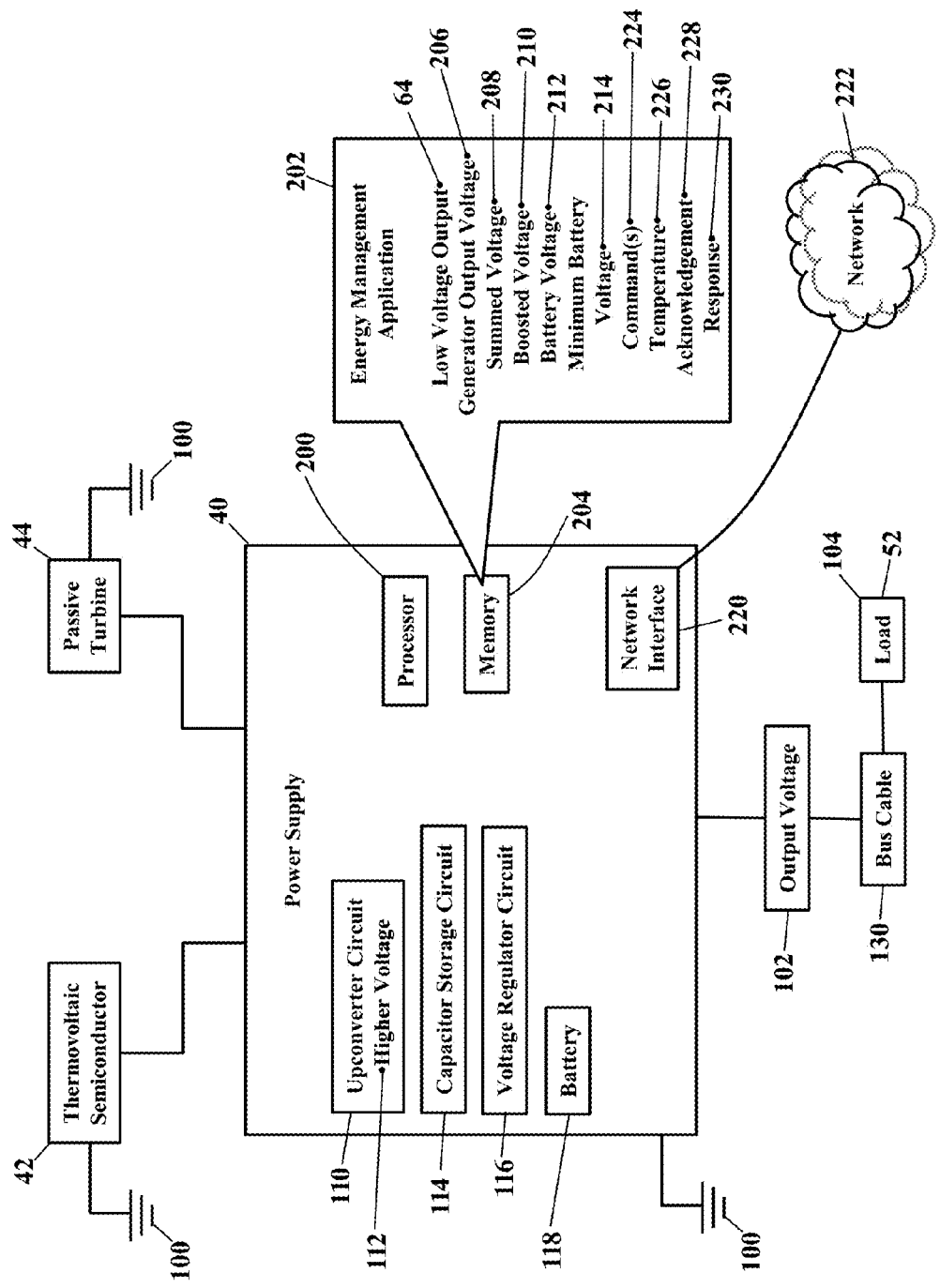
FIGS. 9 & 10 are more block diagrams further illustrating the power supply, according to exemplary embodiments.

FIG. 9 is another block diagram further illustrating the power supply 40, according to exemplary embodiments. Here the power supply 40 may have a processor 200, application specific integrated circuit (ASIC), or other component that executes an energy management application 202 stored in a memory 204. The energy application 202 may cause the processor 200 to receive the low voltage output 64 produced by the thermovoltaic semiconductor 42 (in response to the temperature differential 60). The processor 200 may also receive a generator output voltage 206 generated by the passive turbine 44. The energy application 202 may cause the processor 200 to logically sum these voltages to produce a summed voltage 208. The energy application 202 may then cause the processor 200 to send the summed voltage 208 to the upconverter circuit 110. The upconverter circuit 110 boosts, converts, or steps up the summed voltage 208 to produce a boosted voltage 210. The energy application 202 may then cause the processor 200 to instruct the voltage regulator circuit 116 to condition the boosted voltage 210 to the nearly constant output voltage 102. When the output voltage 102 is immediately needed (such as when illumination is needed), the energy application 202 may then cause the processor 200 to send, or couple, the output voltage 102 to the bus cable 130. When some or all of the output voltage 102 is not needed, the energy application 202 may then cause the processor 200 to send, or couple, the output voltage 102 to the battery 118. The energy application 202 may even cause the processor 200 to perform more energy management functions, such as managing the electrical power stored in the battery 118. The energy application 202 may receive a battery voltage 212 of the battery 118, and the processor 200 actively manages the battery voltage 212 to maintain a minimum value 214.

The power supply 40 may also have a network interface 220 to a communications network 222. Because the power supply 40 may be processor-controlled, the power supply 40 may be remotely monitored and commanded. One or more commands 224 may be addressed to the power supply 40, and these commands 224 instruct the processor 200 and/or the energy management application 202 to perform specified functions. The power supply 40, for example may be remotely commanded to turn "on" or "off" illumination. The power supply 40 may be remotely commanded to report the electrical power being passively generated by the thermovoltaic semiconductor 42 and/or by the passive turbine 44. The power supply 40 may be remotely commanded to report the battery voltage 212 of the battery 118 or power being consumed during illumination of the cabinet 22. The energy application 202 may be remotely commanded to report temperatures 226 inside the cabinet 22 (such as the temperature differential 60 between the first terminal 66 and the second terminal 70, as illustrated in FIG. 2). The power supply 40 may thus send an acknowledgment 228 of each command 224 and/or a response 230 to any command 230.

Exemplary embodiments may be applied regardless of networking environment. The communications network 222 may be a cable network operating in the radio-frequency domain and/or the Internet Protocol (IP) domain. The communications network 222, however, may also include a distributed computing network, such as the Internet (sometimes alternatively known as the "World Wide Web"), an intranet, a local-area network (LAN), and/or a wide-area network (WAN). The communications network 222 may include coaxial cables, copper wires, fiber optic lines, and/or hybrid-coaxial lines. The communications network 222 may even include wireless portions utilizing any portion of the electromagnetic spectrum and any signaling standard (such as the I.E.E.E. 802 family of standards, GSM/CDMA/TDMA or any cellular standard, and/or the ISM band). The communications network 222 may even include powerline portions, in which signals are communicated via electrical wiring. The concepts described herein may be applied to any wireless/wireline communications network, regardless of physical componentry, physical configuration, or communications standard(s).

Figure 10:
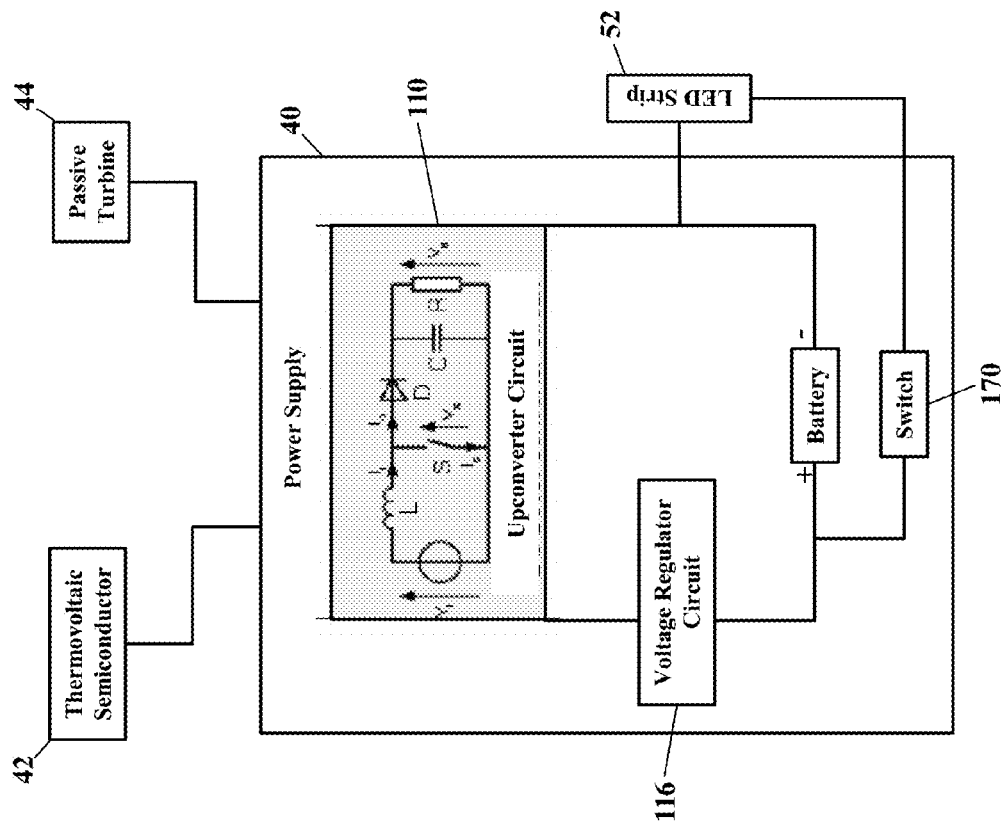

FIG. 10 is another block diagram further illustrating the power supply 40, according to exemplary embodiments. Here, though, the upconverter circuit 110 is schematically illustrated to show its possible circuit components. The upconverter circuit 110 may have an inductor ("L"). The inductor L resists changes in current ("$I_L$"). As the inductor is charged, the inductor absorbs electrical energy. As the inductor is discharged, though, the inductor acts as an energy source to produce a voltage across its terminals. The voltage produced across the inductor terminals (during the discharge phase) is related to a rate of change of the current $I_L$ flowing through the conductor. When switch S is closed, the current $I_L$ increases through the inductor L. When the switch S is open, though, the current $I_L$ must flow through diode D and split through capacitor C and load R. The opening of the switch S results in transferring the energy accumulated in the inductor L into the capacitor C. The capacitor C thus stores the electrical energy produced by the inductor L (resulting in the capacitor storage circuit 114, illustrated in FIGS. 4 & 9).

Figure 11:
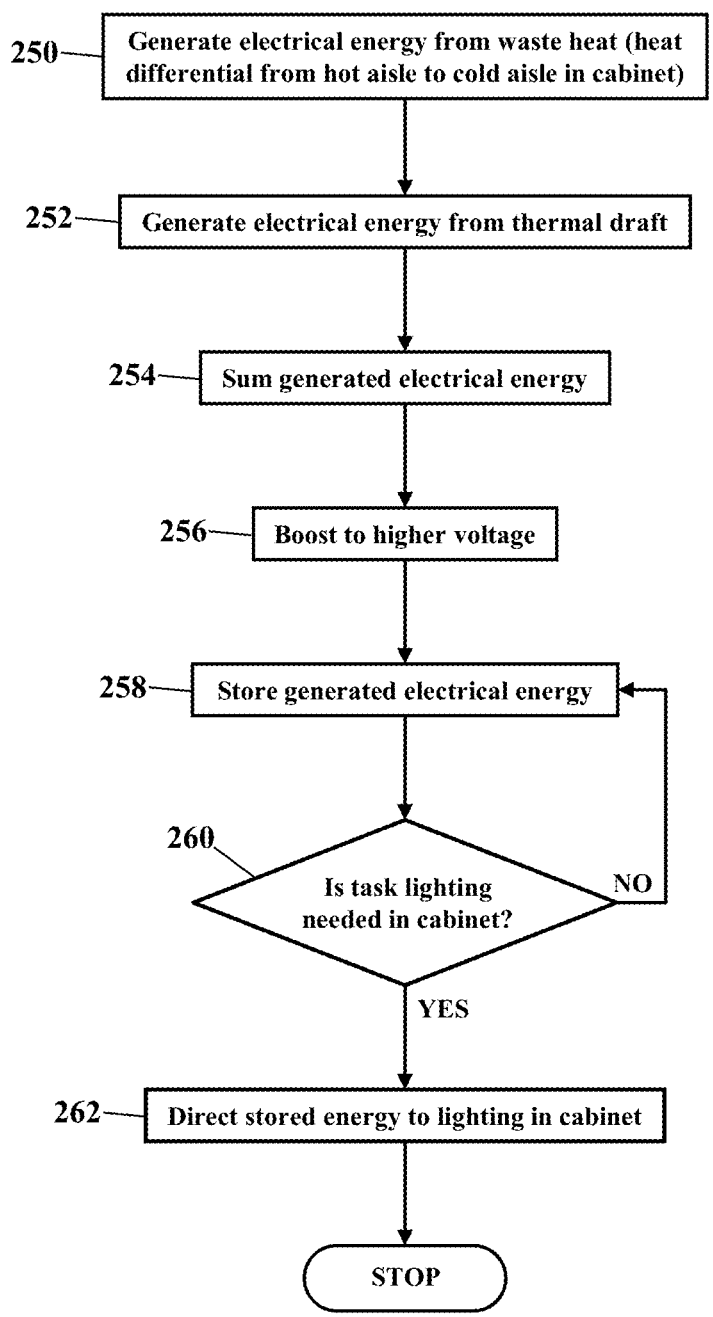
FIG. 11 is a flowchart illustrating a method of passively generating electrical energy from waste heat, according to exemplary embodiments.

FIG. 11 is a flowchart illustrating a method of passively generating electrical energy from the waste heat 28, according to exemplary embodiments. Electrical energy is generated from the waste heat 28 (Block 250). (The waste heat 28, for example, may create a heat differential between a hot aisle and a cold aisle of the data center 20.) Electrical energy is may also be generated from the thermal draft 182 created by the waste heat 28 (Block 252). The electrical energy is summed (Block 254), boosted to a higher voltage (Block 256), and stored in the battery 118 (Block 258). When task lighting in the cabinet 22 is needed (Block 260), the electrical energy stored in the battery 118 is directed to the light sources 52 in the cabinet 22 (Block 262).

Exemplary embodiments may be physically embodied on or in a computer-readable storage medium. This computer-readable medium may include CD-ROM, DVD, tape, cassette, floppy disk, memory card, and large-capacity disks. This computer-readable medium, or media, could be distributed to end-subscribers, licensees, and assignees. A computer program product comprises processor-executable instructions for passively generating electrical energy from the waste heat 28 in the cabinet 22, as the above paragraphs explained.

While the exemplary embodiments have been described with respect to various features, aspects, and embodiments, those skilled and unskilled in the art will recognize the exemplary embodiments are not so limited. Other variations, modifications, and alternative embodiments may be made without departing from the spirit and scope of the exemplary embodiments.

The invention claimed is:
1. An apparatus, comprising:
a cabinet for housing a rack of electronic components, the cabinet having ports to convect waste heat from an interior of the cabinet, the waste heat produced by the electronic components housed within the cabinet;
a thermovoltaic semiconductor having a pair of terminals, a first terminal of the pair of terminals installed proximate an upper frontal area of the cabinet, a second terminal of the pair of terminals installed proximate an exit port of the ports in an opposite upper backside area of the cabinet, the thermovoltaic semiconductor passively generating electrical power in response to a temperature differential between the pair of terminals;
selectively connecting an end of a bus cable to an output terminal of the thermovoltaic semiconductor, the bus cable distributing the electrical power to interior lighting that illuminates an interior of the cabinet; and
series connecting another end of the bus cable to another bus cable in a neighboring cabinet, the bus cable and the another bus cable daisy chained together to electrically distribute the electrical power passively generated by the thermovoltaic semiconductor to the neighboring cabinet.

2. The apparatus of claim 1, further comprising a light emitting diode connected to the bus cable to receive the electrical power and to produce the interior lighting illuminating the interior of the cabinet.

3. The apparatus of claim 1, further comprising a light emitting diode adhesively adhered to an interior sidewall of the cabinet, the light emitting diode connected to the bus cable to receive the electrical power and to produce the interior lighting illuminating the interior of the cabinet.

4. The apparatus of claim 1, further comprising a switch connected between the output terminal of the thermovoltaic semiconductor and the end of the bus cable.

5. The apparatus of claim 4, wherein the switch electrically closes when a door in the cabinet is opened, the switch creating an electrical connection between the output terminal of the thermovoltaic semiconductor and the end of the bus cable.

6. The apparatus of claim 4, wherein the switch electrically opens when a door in the cabinet is closed.

7. A method, comprising:
convecting waste heat from a cabinet, the waste heat produced by electronic components racked within the cabinet;
passively generating electrical power by a thermovoltaic semiconductor, the thermovoltaic semiconductor having a first terminal installed proximate an upper frontal area of the cabinet, the thermovoltaic semiconductor having a second terminal installed proximate an exit port in an opposite upper backside area of the cabinet, the thermovoltaic semiconductor passively generating the electrical power in response to a temperature differential between the first terminal and the second terminal caused by the waste heat produced by the electronic components in the cabinet;
selectively connecting an end of a bus cable to an output terminal of the thermovoltaic semiconductor, the bus cable distributing the electrical power to interior lighting that illuminates an interior of the cabinet; and
series connecting another end of the bus cable to another bus cable in a neighboring cabinet racking additional electronic components, the bus cable and the another bus cable daisy chained together to electrically distribute the electrical power passively generated by the thermovoltaic semiconductor to the additional electronic components racked in the neighboring cabinet.

8. The method of claim 7, further comprising connecting a light emitting diode to the bus cable to receive the electrical power and to produce the interior lighting illuminating the interior of the cabinet.

9. The method of claim 8, further comprising adhesively adhering the light emitting diode to an interior sidewall of the cabinet.

10. The method of claim 7, further comprising connecting a switch between the output terminal of the thermovoltaic semiconductor and the end of the bus cable.

11. The method of claim 10, further comprising closing the switch when a door in the cabinet is opened, the switch creating an electrical connection between the output terminal of the thermovoltaic semiconductor and the end of the bus cable.

12. The method of claim 10, further comprising opening the switch when a door in the cabinet is closed.

13. The method of claim 7, further comprising storing the electrical power passively generated by the thermovoltaic semiconductor in a battery housed within the cabinet.

* * * * *